(12) United States Patent
Kato et al.

(10) Patent No.: US 6,178,123 B1
(45) Date of Patent: Jan. 23, 2001

(54) SEMICONDUCTOR DEVICE WITH CIRCUIT FOR PHASING INTERNAL CLOCK SIGNAL

(75) Inventors: Yoichi Kato; Tsukasa Ooishi, both of Hyogo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/377,904

(22) Filed: Aug. 20, 1999

Related U.S. Application Data

(63) Continuation of application No. 09/170,223, filed on Oct. 13, 1998, now Pat. No. 5,995,441.

(30) Foreign Application Priority Data

Apr. 27, 1998 (JP) .................................................. 10-116979

(51) Int. Cl.[7] .................................. G11C 7/00; H03L 7/06
(52) U.S. Cl. ............................................. 365/194; 327/158
(58) Field of Search ..................................... 327/147, 149, 327/150, 156, 158, 159; 365/194

(56) References Cited

U.S. PATENT DOCUMENTS

| | | | |
|---|---|---|---|
| 5,247,485 | 9/1993 | Ide ........................................ | 365/233 |
| 5,550,783 | 8/1996 | Stephens Jr., et al. ............... | 365/233 |
| 5,740,123 | 4/1998 | Uchida ................................. | 365/233 |
| 5,781,055 * | 7/1998 | Bhagwan ............................. | 327/158 |
| 5,790,612 * | 8/1998 | Chengson et al. ................... | 327/148 |
| 5,815,016 * | 9/1998 | Erickson .............................. | 327/156 |
| 5,822,255 | 10/1998 | Uchida ............................... | 365/194 |
| 5,896,347 | 4/1999 | Tomita et al. ....................... | 365/233 |

FOREIGN PATENT DOCUMENTS 9-293374   11/1997   (JP) .

* cited by examiner

Primary Examiner—Trong Phan
(74) Attorney, Agent, or Firm—McDermott, Will & Emery

(57) ABSTRACT

An initial delay control data decision circuit detects to which portion of a variable delay circuit a pulse signal of an external clock signal of one cycle is propagated for a predetermined period of time, to determine an initial value for delay control data. Depending on the initial value for delay control data, a delay locked loop circuit configured of the variable delay circuit, a phase comparator circuit, a shift logic circuit, a delay control data holding circuit, a variable constant current circuit and a voltage generating circuit controls phasing of internal and external clock signals.

11 Claims, 16 Drawing Sheets

SEMICONDUCTOR DEVICE WITH CIRCUIT FOR PHASING INTERNAL CLOCK SIGNAL

This application is a continuation of application Ser. No. 09/170,223 filed Oct. 13, 1998, now U.S. Pat. No. 5,995,441.

BACKGROUND OF THE INVENTION

1. Field of the Invention

The present invention relates to semiconductor memory devices and in particular to a synchronous semiconductor memory device which operates synchronously with an external clock signal. More specifically, the present invention relates to a semiconductor memory device with an internally provided, synchronized signal generating circuit, such as a delay locked loop (DLL) circuit, which receives an external clock signal and generates an internal clock signal synchronized with the external clock signal.

2. Description of the Background Art

With the recent enhancement in the operating speeds of microprocessors (MPUs), a synchronous DRAM (SDRAM) or the like which operates synchronously with a clock signal has been used to provide rapid access to e.g. dynamic random access memory (DRAM) used as a main memory device. For such a semiconductor memory device operating synchronously with an external clock signal, a PLL or DLL circuit or the like for generating an internal clock signal synchronized with the external clock signal is typically mounted internal to the semiconductor memory device.

FIG. 17 is a schematic block diagram showing a configuration of a conventional, internally provided, synchronized signal generating circuit 3000 disclosed in Japanese Patent Laying-Open No. 9-293374.

Referring to FIG. 17, synchronized signal generating circuit 3000 includes: a delay circuit 3110 receiving an external clock signal Ext.CLK, delaying the received external clock signal Ext.CLK for a predetermined period of time and outputting the delayed external clock signal Ext.CLK; a phase comparator 3120 receiving external clock signal Ext.CLK and an output of delay circuit 3110 and detecting the phase difference between them; a switching decoder 3130 outputting a constant current supply switch signal CS depending on the detected result from phase comparator 3120; a variable, constant current supply circuit 3140 receiving signal CS to supply the value of a constant current corresponding thereto; and a delay control circuit 3150 outputting a control signal which controls the amount of delay of delay circuit 3110 depending on the value of the constant current output from variable, constant current supply circuit 3140.

Delay circuit 3110 includes inverter circuits Inv.1 to Inv.n cascaded in n stages. Each inverter circuit Inv.i (i=1, 2, ... n) is coupled with a power supply potential Vcc via a p-channel MOS transistor P1$i$ and also with a ground potential GND via an n-channel MOS transistor N1$i$. P- and n-channel MOS transistors P1$i$ and N1$i$ have their respective gate potential levels controlled by delay control circuit 3150.

More specifically, delay control circuit 3150 controls the value of the current supplied to inverter circuits Inv.1 to Inv.n configuring delay circuit 3110. In other words, the delay time at each inverter circuit Inv.i (i=1, 2, ... n) varies depending on the control signal from delay control circuit 3150.

Variable, constant current supply circuit 3140 includes m internally provided, constant current supply circuits CS11, CS21, ..., CSm1, and m internally provided, constant current supply circuits CS12, CS22, ..., CSm2. Constant current supply circuit CS11 has one end connected to power supply potential Vcc and the other end connected to an output node 3140$a$ via a switch circuit SW11 which is opened and closed in response to constant current supply switch signal CS.

The other constant current supply circuits CS21, ... CSm1 each have one end similarly connected to power supply potential Vcc and the other end connected to output node 3140$a$ via switch circuits SW21, ... SWm1, respectively.

Constant current supply circuits CS12, CS22, ..., CSm2 each have one end connected to output node 3140$a$ via the respectively associated switch circuits SW12, SW22, ..., SWm2 controlled by constant current supply switch signal CS to be opened and closed, and the other end connected to power supply potential GND.

Thus, the value of the constant current supplied to output node 3140$a$ is increased when switch circuits SW11, SW21, ..., SWm1 conduct, and it is decreased when switch circuits SW12, SW22, ..., SWm2 conduct.

Thus, depending on the value of constant current supply switch signal CS, switch circuits SW11, SW21, ..., SWm1 and switch circuits SW12, SW22, ..., SWm2 are each opened/closed to output to output node 3140$a$ a corresponding value of constant current depending on which delay control circuit 3150 operates, as described later.

Variable, constant current supply circuit 3140 also includes a free-running current supply 3444 which normally supplies a predetermined value of constant current to output node 3140$a$. More specifically, a predetermined free-running current is always supplied to the output node while switch circuits SW11 to SWm1 and SW12 to SWm2 are all in the non-conductive state.

Delay control circuit 3150 includes: an n-channel MOS transistor N31 having its drain connected to output node 3140$a$ and its source connected to ground potential GND; and an n-channel MOS transistor N32 having its source connected to ground potential GND and its gate connected to the gate of n-channel MOS transistor N31. The drain and gate of n-channel MOS transistor N31 are connected to each other, and n-channel MOS transistors N31 and N32 configure a current mirror circuit.

Delay control circuit 3150 also includes a p-channel MOS transistor P31 having its source connected to power supply potential Vcc and its drain connected to the drain of n-channel MOS transistor N32. The gate of n-channel MOS transistor N32 is connected to the gates of n-channel MOS transistors N11 to N1$n$ of delay circuit 3110, and the value of the drain current flowing through n-channel MOS transistors N11 to N1$n$ is controlled depending on the value of the current flowing through n-channel MOS transistors N31 and N32 configuring a current mirror circuit.

The gate of p-channel MOS transistor P31 is connected to the gates of p-channel MOS transistors P11 to P1$n$ in delay circuit 3110. Since the gate and drain of p-channel MOS transistor P31 are connected to each other, p-channel MOS transistors P31 and P11 configure a current mirror circuit. Thus, the value of the drain current flowing through each of p-channel MOS transistors P11 to P1$n$ is the same as the value of the drain current flowing through n-channel MOS transistors N31 and N32 configuring a current mirror circuit.

Thus, the value of the current supplied to each of inverter circuits Inv.1 to Inv.n configuring delay circuit 3110 is controlled depending on the value of the current supplied to output node 3140$a$ of variable, constant current supply circuit 3140.

An operation of synchronized signal generating circuit 3000 will now be described briefly.

For a delay time provided by delay circuit 3110 that is shorter than the time period of one cycle of external clock signal Ext.CLK, a signal output from delay circuit 3110 receiving external clock signal Ext.CLK precedes external clock signal Ext.CLK in phase. Depending on the phase difference detected in phase comparator 3120, switching decoder 3130 controls variable, constant current supply circuit 3140 by means of constant current supply switch signal CS to delay the advanced phase of the signal output from delay circuit 3110 to reduce the value of the constant current output to output node 3140a. Responsively the value of the drain current flowing through the current mirror circuit configured of n-channel MOS transistors N31 and N32 is reduced and so is the value of the current supplied to each of inverter circuits Inv.i (i=1, 2, . . . n) configuring delay circuit 3110.

Thus inverter circuits Inv.1 to Inv.n provide increased delay time and delay circuit 3110 receiving external clock signal Ext.CLK outputs a signal delayed in phase.

That is, the phase difference between external clock signal Ext.CLK and the signal output from delay circuit 3110 changes so that they are synchronized with each other.

For a delay time provided by delay circuit 3110 that is longer than the time period of one cycle of external clock signal Ext.CLK, the inverted version of the above operation can be provided to synchronize internal clock signal int.CLK output from delay circuit 3110 with external clock signal Ext.CLK.

However, the conventional, synchronized signal generation circuit 3000 configured as described above has the following disadvantages.

An DLL circuit and the like cannot be used until an external clock signal and a clock signal start to synchronize with each other, and the time required until the synchronization operation is completed is disadvantageously prolonged if the possible range of a delay control data is increased to enhance the precision of phasing.

Furthermore, in controlling the delay time of the DLL circuit or the like, a delay control data held in e.g. the decimal notation disadvantageously results in an increased number of bits and that held in the binary notation, which reduces the number of bits, disadvantageously results in an increased number of the elements of the decoder circuit and hence reduction in speed.

SUMMARY OF THE INVENTION

An object of the present invention is to provide a synchronous semiconductor memory device having an internally provided, synchronized signal generation circuit capable of reducing the time required for completion of a synchronization operation when the precision in phasing is improved.

Another object of the present invention is to provide a synchronous semiconductor memory device having an internally provided, synchronized signal generation circuit capable of reducing increase in number of circuit elements and rapidly controlling a delay time when a delay control data represented in the binary notation is used to control the amount of delay in a delay circuit.

To sum up, the present invention is a synchronous semiconductor memory device receiving an address signal and a control signal synchronously with an external clock signal and including a memory cell array, a control circuit, a cell select circuit, an internally provided, synchronized signal generation circuit, and a control signal input circuit.

The memory cell array has a plurality of memory cells arranged in a matrix. The control circuit responds to the control signal to control an operation of the synchronous semiconductor memory device. The cell select circuit responds to the address signal to select a memory cell and thus transmits and receives stored data to and from the selected memory cell.

The synchronized signal generation circuit outputs an internal clock signal synchronized with the external clock signal.

The synchronized signal generation circuit includes: a delay locked loop circuit which receives the external clock signal, delays the external clock signal depending on the amount of delay stored and synchronizes the phase of the delayed signal with that of the external clock signal to output an internal clock signal; and a delay detector circuit which detects the amount of delay of the external clock signal in the delay locked loop circuit to determine and apply an initial value for the amount of delay to the delay locked loop circuit.

The control signal input circuit is provided corresponding to the control circuit, and receives the control signal and the address signal in synchronization with the internal clock signal.

Preferably the delay control circuit includes a variable constant current circuit generating a control current depending on the amount of delay held in a storage circuit. The variable constant current circuit has a plurality of first constant current supplies having the jth first constant current supply generating a current of $2^{j-1} \times I$ and a plurality of second constant current supplies having the kth second constant current supply generating a current of $I/2^k$, wherein I represents a predetermined value of current and j and k represent natural numbers, and the variable constant current circuit also has a current combination circuit which selectively combines a current from a first constant current supply and a current from a second constant current supply depending on the amount of delay held in the storage circuit to generate a control current, and the delay time of a variable delay circuit is controlled depending on the value of the control current.

Thus, the main advantage of the present invention is that since the delay detector circuit previously detects the initial value of the amount of delay control to set the amount of delay of the delay locked loop circuit, the time required until a synchronization operation is completed can be reduced when the precision in phasing is improved.

Another advantage of the present invention is that since a value of current obtained by combining a current from a constant current supply cell generating a current of $2^{j-1} \times I$ and a current from a constant current supply cell generating a current of $I/2^k$ is used to control the delay time of the variable delay circuit, increase in number of circuit elements can be reduced and the delay time can rapidly be controlled if an amount of delay is represented in the binary notation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
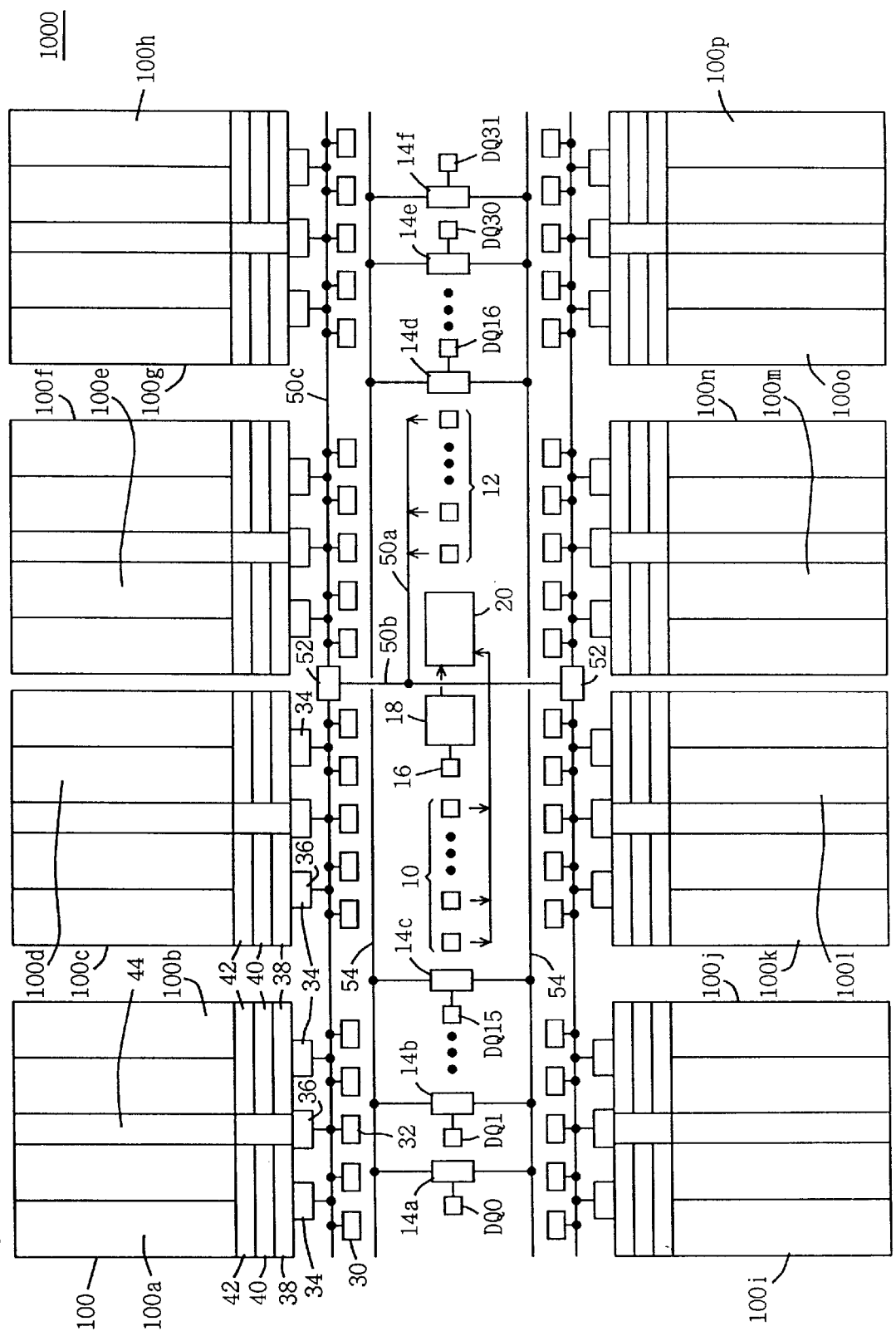
FIG. 1 is a schematic block diagram showing a configuration of a synchronous semiconductor memory device 1000 according to an embodiment of the present invention.

FIG. 1 is a block diagram showing a configuration of a synchronous semiconductor memory device 1000 according to an embodiment of the present invention.

Referring to FIG. 1, synchronous semiconductor memory device 1000 includes: a control circuit 20 receiving external control signals /RAS, /CAS, /W, /CS and the like applied via a group of external control signal input terminals 10 to produce an internal control signal; and a memory cell array 100 having memory cells arranged in a matrix.

Memory cell array 100 is arranged such that it is divided into a total of 16 memory cell blocks 100a to 100p, as shown in FIG. 1. When synchronous semiconductor memory device 1000 has a memory capacity of e.g. 1 G bit, each memory cell block has a capacity of 64M bits. Each block can operate independently as a bank.

External address signals A0 to Ai provided via a group of address signal input terminals 12 are controlled by control circuit 20 to be transmitted via address buses 50a and 50b to an address driver 52. The address signals are further transmitted from address driver 52 via an address bus 50c to each memory cell block.

Synchronous semiconductor memory device 1000 also includes: a row predecoder 36 provided for each pair of memory cell blocks and controlled by control circuit 20 to latch and predecode a row address transmitted on address bus 50c; a row decoder 44 selecting a corresponding row (i.e. a word line) of a memory cell block that is selected based on an output from row predecoder 36; a predecoder 34 provided for each memory cell block and controlled by control circuit 20 to latch and predecode a column address transmitted on address bus 50c; a column predecoder 40 further predecoding a column address according to an output from predecoder 34; and a column decoder 42 selecting a corresponding column (i.e. a pair of bit lines) of a memory cell block that is selected based on an output from column predecoder 40.

Synchronous semiconductor memory device 1000 also includes: data input/output terminals DQ0 to DQ15 and DQ16 to DQ31 arranged in a region of the central portion of the chip in the direction of the longer side of the chip outer than the group of external control signal input terminals 10 and the group of address signal input terminals 12; input/output buffer circuits 14a to 14f respectively provided for data input/output terminals DQ0 to DQ31; a data bus 54 transmitting data between an input/output buffer and an associated memory cell block; and a read/write amplifier 38 provided for each of memory cell blocks 100a to 100p for communicating data between data bus 54 and a selected column of memory cells.

Signal /RAS provided to the group of external control signal input terminals 10 is a row address strobe signal which starts an internal operation of the semiconductor memory device and also determines the activation period of the internal operation. The circuitry related to the operation of selecting a row of memory cell array 100, such as row decoder 44, is activated in response to activation of signal /RAS. Signal /CAS provided to the group of external control signal input terminals 10 is a column address strobe signal and activates the circuitry selecting a column of memory cell array 100.

Signal /CS provided to the group of external control signal input terminals 10 is a chip select signal indicating that synchronous semiconductor memory device 100 is selected, and signal /W indicates a write operation in synchronous semiconductor memory device 1000.

Synchronous semiconductor memory device 1000 also includes an internally provided, synchronized signal generation circuit 18 which receives external clock signal Ext.CLK applied from a clock signal input terminal 16 and is controlled by control circuit 20 to start a synchronization operation to output internal clock signal int.CLK.

The operations of taking in signals /CS, /RAS, /CAS and /W are synchronized with internal clock signal int.CLK.

Furthermore, the operation of taking in address signals provided to the group of address signal input terminals 12, and the data communication via data input/output terminals DQ0 to DQ31 are also synchronized with internal clock signal int.CLK.

A redundant column select circuit 30 selects a redundant column when an address signal corresponds to a previously held, defective bit column address. A redundant row select circuit 32 selects a redundant row when an address signal corresponds to a previously held, defective bit row address.

Figure 2:
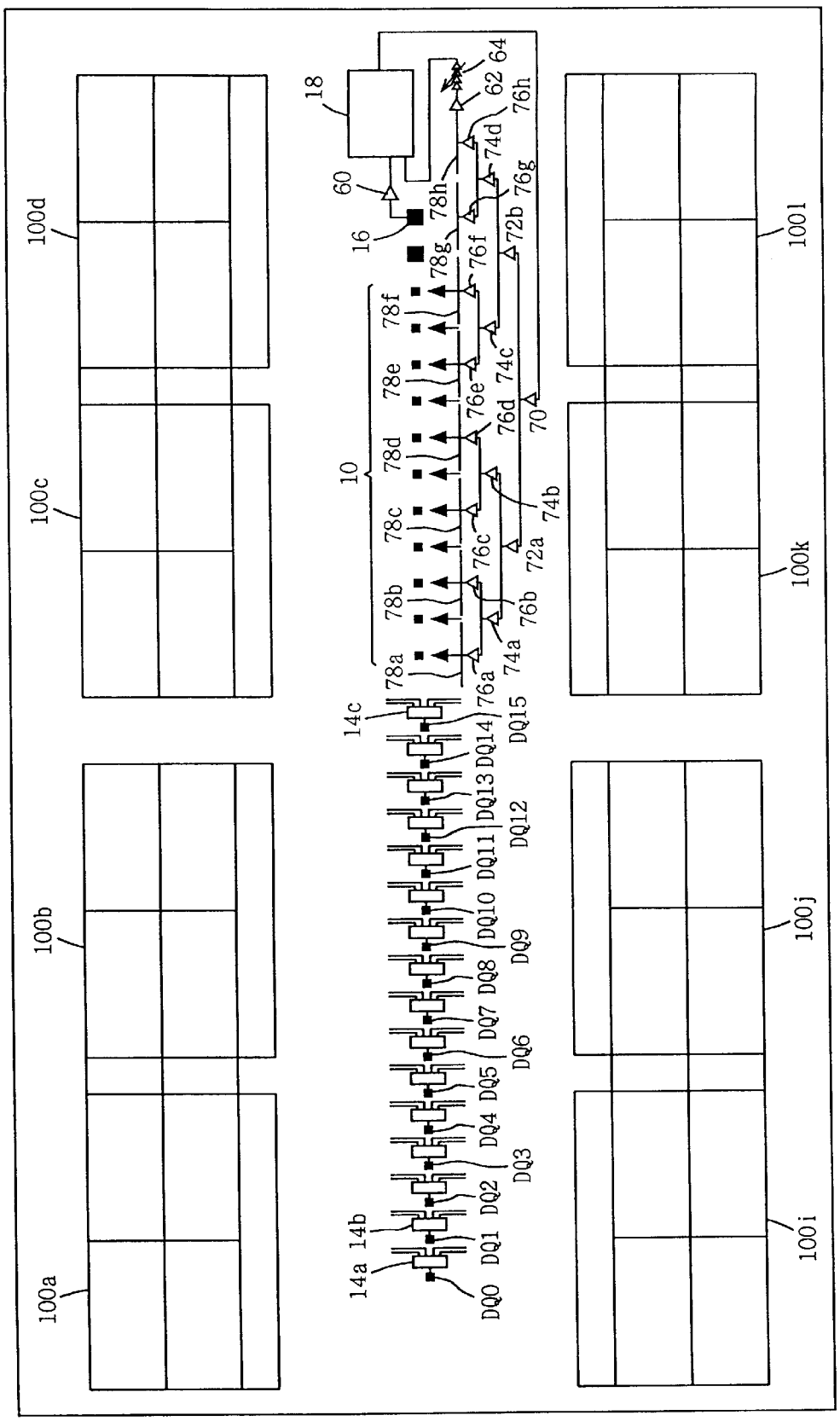
FIG. 2 is a conceptual view of a configuration distributing an internal clock signal int.CLK in synchronous semiconductor memory device 1000.

FIG. 2 is a conceptual view showing a configuration distributing internal clock signal int.CLK in synchronous semiconductor memory device 1000 shown in FIG. 1 to each of the input terminals in the group of external control signal input terminals 10.

Referring to FIG. 2, external clock signal Ext.CLK provided to clock signal input terminal 16 is applied via buffer circuit 60 to synchronized signal generating circuit 18.

Internal clock signal int.CLK output from synchronized signal generating circuit 18 is first provided to a buffer circuit 70. An output of buffer circuit 70 is divided in two and the divided outputs are provided to buffer circuits 72a and 72b, respectively.

An output of buffer circuit 72a is also divided in two and the divided outputs are provided to buffer circuits 74a and 74b, respectively.

An output of buffer circuit 72b is also divided in two and the divided outputs are provided to buffer circuits 74c and 74d, respectively.

The outputs of buffer circuits 74a, 74b, 74c and 74d are also each divided in two and the divided outputs are respectively provided to buffer circuits 76a and 76b, 76c and 76d, 76e and 76f, and 76g and 76h.

That is, the output of buffer circuit 70 is successively divided in two and ultimately into eight clock signals. The eight clock signals are respectively provided to interconnections 78a to 78h. The group of external control signal input terminals 10 take in the external control signals in synchronization with a clock signal provided from each of interconnections 78a to 78h.

A clock signal from an end of interconnection 78h is applied via a replica buffer circuit 62 and a delay adjustment circuit 64 to synchronized signal generating circuit 18 which synchronizes the phase of an output from delay adjustment circuit 64 with that of external clock signal Ext.CLK provided from buffer circuit 60 to produce internal clock signal int.CLK.

If there is not delay adjustment circuit 64, external clock signal Ext.CLK provided to buffer circuit 60 and the clock signal on interconnection 78h provided to replica buffer circuit 62 are adjusted to have the same phase, since buffer circuit 60 and replica buffer circuit 62 have a similar configuration. It should be noted that the phase of the clock signal on interconnection 78h is the same as those of the clock signals on the other interconnections 78a to 78g.

In other words, the external control signal feeding operations are synchronized with external clock signal Ext.CLK.

Delay adjustment circuit 64 is required for adjusting the difference between the amplitude level of external clock signal Ext.CLK, the ratio of the external clock signal activation period to the external clock signal cycle and the like, and the corresponding amplitude level, ratio and the like of internal clock signal int.CLK.

Figure 3:
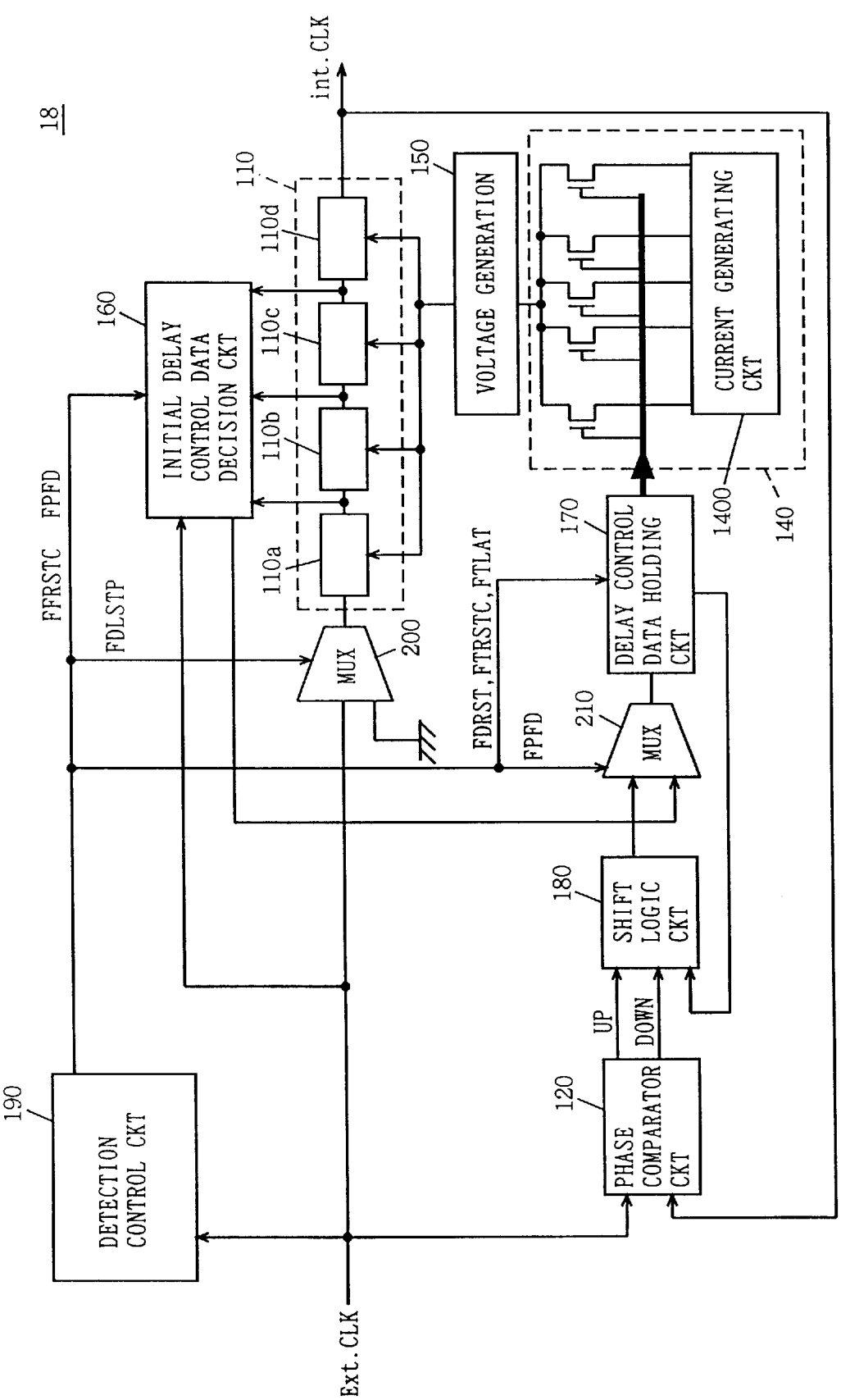
FIG. 3 is a schematic block diagram showing a configuration of synchronized signal generation circuit 18 shown in FIG. 1.

While FIG. 2 shows a configuration of distribution of internal clock signal int.CLK for the group of external control signal input terminals 10, a similar configuration is also provided for the group of address signal input terminals 12 and the group of data input/output terminals DQ0 to DQ31 and thus allows address signals to be taken in and data signals to be communicated also synchronously with external clock signal Ext.CLK FIG. 3 is a schematic block diagram showing a configuration of synchronized signal generating circuit 18 shown in FIG. 1.

Referring to FIG. 3, synchronized signal generating circuit 18 includes: a detection control circuit 190 which controls the operation of determining an initial value of delay control data of synchronized signal generating circuit 18; a multiplexer 200 receiving external clock signal Ext.CLK and a signal of the ground potential level and controlled by detection control circuit 190 to selectively output one of the signals; a variable delay circuit 110 which receives an output from multiplexer 200 and delays the output from multiplexer 200 by a delay time depending on the delay control data to output internal clock signal int.CLK; a phase comparator circuit 120 receiving an output from variable delay circuit 110 (i.e. internal clock signal int.CLK) and external clock signal Ext.CLK and comparing their phases to activate either an UP signal or a DOWN signal depending on whether phase of internal clock signal int.CLK is advanced or delayed; a shift logic circuit 180 which increases/decreases and thus outputs the delay control data depending on the UP and DOWN signals from phase comparator circuit 120; a multiplxer 210 receiving an output from shift logic circuit 180 and the initial value for the delay control data and controlled by detection control circuit 190 to output either the output from shift logic circuit 180 or the initial value for the delay control data; a delay control data holding circuit 170 which receives an output from multiplexer 210 and holds the output from multiplexer 210 as delay control data; a variable constant current circuit 140 which outputs a value of current depending on the delay control data held in delay control data holding circuit 170; and a voltage generating circuit 150 receiving an output from variable constant current circuit 140 to generate reference voltages Vrp and Vrn.

Variable delay circuit 110 includes four delay circuits 110a to 110d connected in series to each other, although it is not particularly limited to such a configuration.

Delay circuits 100a to 100d each transmit a signal provided from multiplexer 200 in a delay time depending on reference voltages Vrp and Vrn.

Synchronized signal generating circuit 18 also includes an initial delay control data decision circuit 160 which is controlled by detection control circuit 190 to detect which of delay circuits 110a to 110d a test signal corresponding to a pulse signal of one cycle of external clock signal Ext.CLK provided from multiplxer 200 to variable delay circuit 110 reaches for a predetermined period of time, such as the time period of one cycle of external clock signal Ext.CLK, to determine an initial value for delay control data.

The initial value for delay control data determined by initial delay control data decision circuit 160 is applied to multiplexer 210.

Multiplexer 210 is controlled by detection control circuit 190 to provide the initial value for delay control data to delay control data holding circuit 170.

After an initial value is determined and thus held in delay control data holding circuit 170, an output signal from delay control data holding circuit 170 is applied to shift logic circuit 180 and multiplexer 210 provides an output from shift logic circuit 180 to delay control data holding circuit 170.

Figure 4:
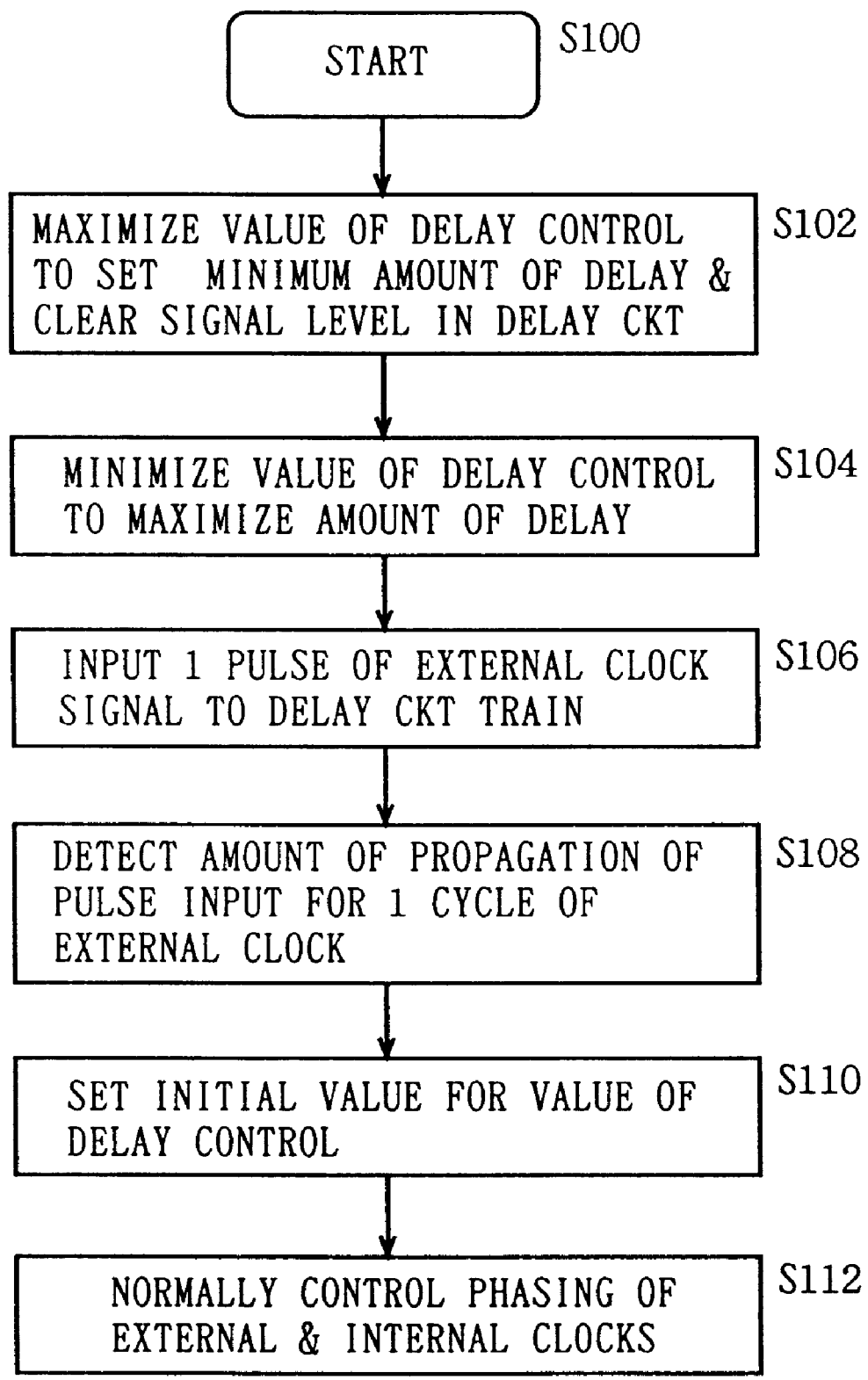
FIG. 4 is a flow chart for describing an operation of synchronized signal generation circuit 18.

An operation of synchronized signal generating circuit 18 will now be outlined. FIG. 4 is a flow chart representing the operation of synchronized signal generating circuit 18.

Referring to FIG. 4, when synchronized signal generating circuit 18 starts to operate (step S100), delay control data held in delay control data holding circuit 170 is controlled by detection control circuit 190 and thus set to be maximized, i.e. to minimize an amount of delay. Then detection control circuit 190 controls multiplexer 200 to apply a signal of the ground potential level to variable delay circuit 110 to clear the signal level in variable delay circuit 110 (step S102).

Then the delay control data held in delay control data holding circuit 170 is controlled by detection control circuit 190 and thus set to be minimized, i.e. to maximize the amount of delay (step S104).

Detection control circuit 190 controls and thus allows multiplexer 200 to input one pulse of external clock signal Ext.CLK as a test signal to variable delay circuit 110 (step 106).

Initial delay control data decision circuit 160 detects which of delay circuits 110a to 110d the test signal reaches for the time period of one cycle of external clock signal Ext.CLK (step S108).

Initial delay control data decision circuit 160 determines an initial value for delay control data depending on the detected result. Detection control circuit 190 controls and thus allows multiplexer 210 to store the determined initial value for delay control data in delay control data holding circuit 170 (step S110).

Thereafter detection control circuit 190 controls multiplexer 210 to provide the output of shift logic circuit 180 to delay control data holding circuit 170 and also controls multiplexer 200 to provide external clock signal Ext.CLK to variable delay circuit 110. Thus, a delay locked loop circuit configured of variable delay circuit 110, phase comparator circuit 120, shift logic circuit 180, delay control data holding circuit 170, variable constant current circuit 140 and voltage generating circuit 150 controls the phasing of internal and external clock signals int.CLK and Ext.CLK (Step S112).

Figure 5:
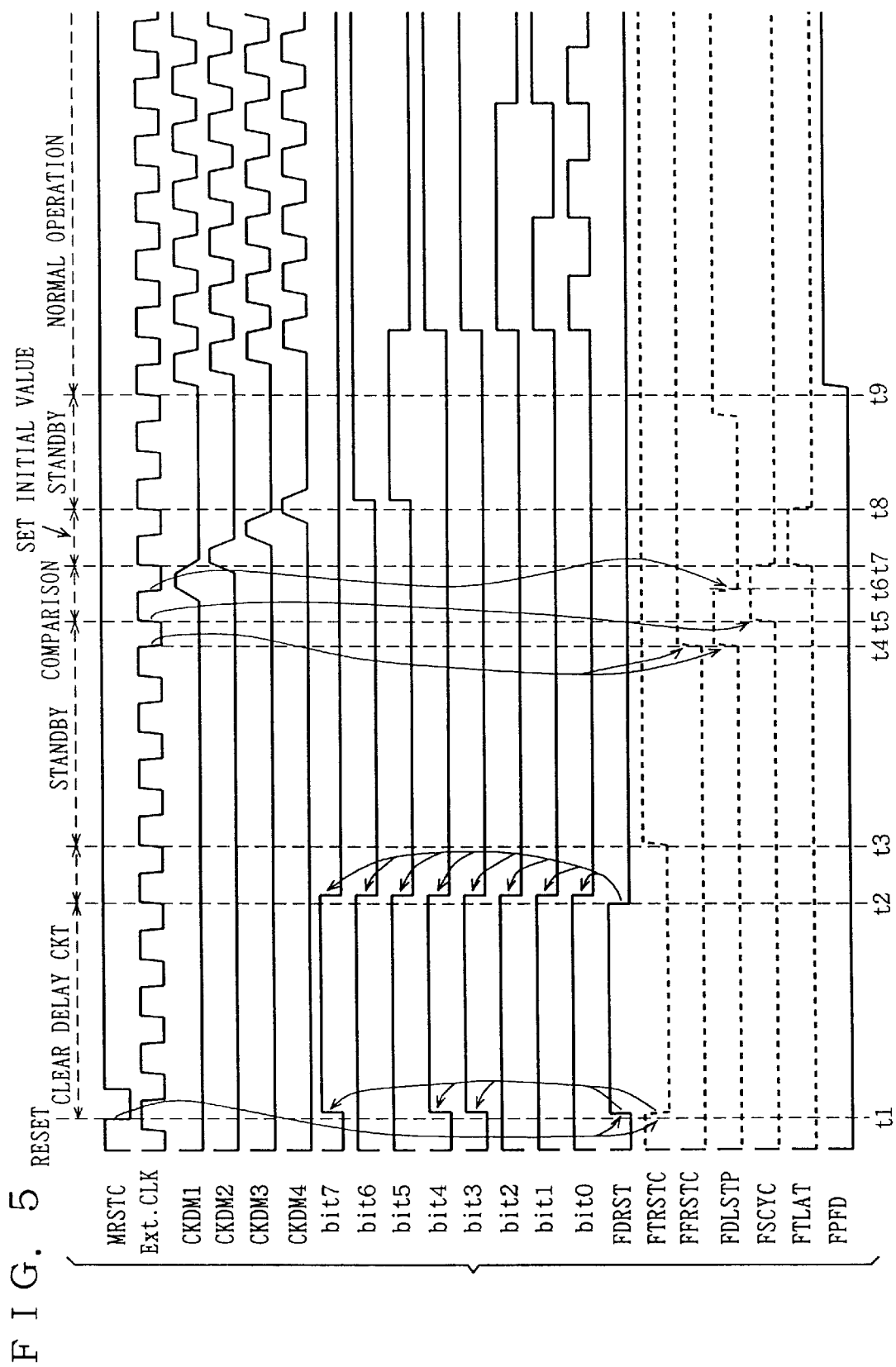
FIG. 5 is timing charts for more specifically representing the operation of synchronized signal generation circuit 18 shown in FIG. 3.

FIG. 5 is a timing chart for more specifically representing the operation of synchronized signal generating circuit 18 shown in FIG. 3.

Referring to FIGS. 3, 4 and 5, at time t1, a reset signal MRSTC from control circuit 20 attains an active low level and responsively signals FDRST and FTRSTC output from detection control circuit 190 respectively attains a high level and an active low level. In response to the activated signal FTRSTC, bit 0 to bit 7 of the bit data in the binary notation of delay control data held in delay control data holding circuit 170 are all attain a high level, corresponding to the level of signal FDRST. That is, the delay control data is reset to be maximized. Meanwhile, multiplexer 200 selects a signal of the ground potential level to reset the signal level in variable delay circuit 110.

At time t2, signal FDRST then attains a low level in response to a low-to-high transition of external clock signal Ext.CLK. Responsively, bit 0 to bit 7 of the delay control data are all reset to a low level, since signal FTRSTC is maintained at a low level. That is, the delay control data is reset to be minimized. At time t3, signal FTRSTC returns to a high level.

For the period of times t3 through t4, synchronized signal generating circuit 18 is in a standby state.

In response to a high-to-low transition of external clock signal Ext.CLK at time t4, signal FRSTC attains a high level to reset the state of initial delay control data decision circuit 160. Simultaneously, signal FDLSTP attains an active high level to allow multiplexer 200 to pass external clock signal Ext.CLK.

In response to a low-to-high transition of external clock signal Ext.CLK at time t5, signal FSCYC attains an active high level, indicating the initiation of the time for one cycle of external clock signal Ext.CLK to allow initial delay control data decision circuit 160 to provide the operation of detecting the propagation of a test signal in variable delay circuit 110.

In response to a high-to-low transition of external clock signal Ext.CLK at time t6, signal FDLSTP attains an inactive low level and allows multiplexer 200 to again select a signal of the ground level. That is, the external clock signal Ext.CLK for the period of times t5 through t6 is passed as a test signal through multiplexer 200 and applied to variable delay circuit 110.

In response to a high-to-low transition of external clock signal Ext.CLK at time t7, signal FSCYC attains an inactive low level. At this time point, initial delay control data decision circuit 160 detects to which of delay circuits 110a to 110d of variable delay circuit 110 the test signal is transmitted.

In response to a high-level activation of signal FTLAT at time t7, an initial value for delay control data determined by initial delay control data decision circuit 160 is stored in delay control data holding circuit 170 via multiplexer 210.

After signal FDLSTP is activated and multiplexer 200 is thus allowed to select and pass external clock signal Ext.CLK, signal FPFD attains an active high level in response to a low-to-high transition of external clock signal Ext.CLK at time t9 and multiplexer 210 thereafter selects the output from shift logic circuit 180.

Thus, a delay locked loop circuit configuring of variable delay circuit 110, phase comparator circuit 120, shift logic circuit 180, delay control data holding circuit 170, variable constant current circuit 140 and voltage generating circuit 150 controls the phasing of internal and external clock signals int.CLK and Ext.CLK.

A more specific configuration will now be described which allows synchronized signal generating circuit 18 shown in FIG. 3 to implement the operation shown in FIG. 5.

Figure 6:
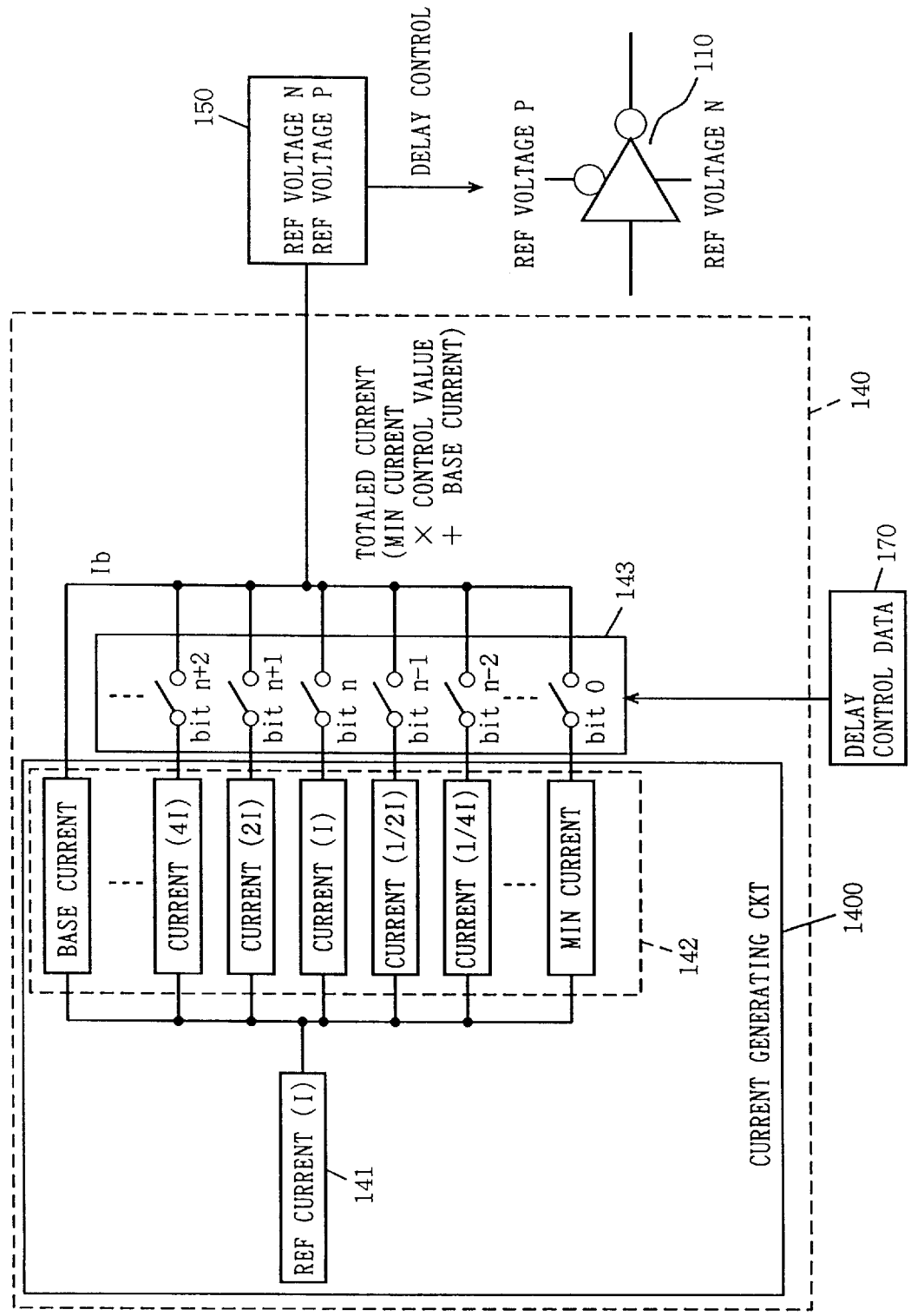
FIG. 6 is a schematic block diagram for more specifically showing a configuration of variable constant current circuit 140.

FIG. 6 is a schematic block diagram more specifically showing a configuration of variable constant current circuit 140.

Variable constant current circuit 140 includes: a current generating circuit 1400 which generates a base current Ib and also generates a current of $2^{j-1} \times I$ and a current of $I/2^k$ for a value of a reference current I, wherein j and k represent predetermined natural numbers; and a current combining circuit 143 which combines currents from current generating circuit 1400 depending on the delay control data from delay control data holding circuit 170.

Current generating circuit 1400 includes: a reference current generating circuit 141 which generates the value of reference current I; and a group of contact current supple cells 142 having a plurality of constant current supply cells generating currents of $2^{j-1} \times I$ and $I/2^k$ based on the reference current I.

In response to an output from current combining circuit 143, voltage generating circuit 150 produces reference voltages Vrp and Vrn. Delay circuits 110a to 110d transmit a signal according to a delay time depending on the values of reference voltages Vrp and Vrn.

Figure 7:
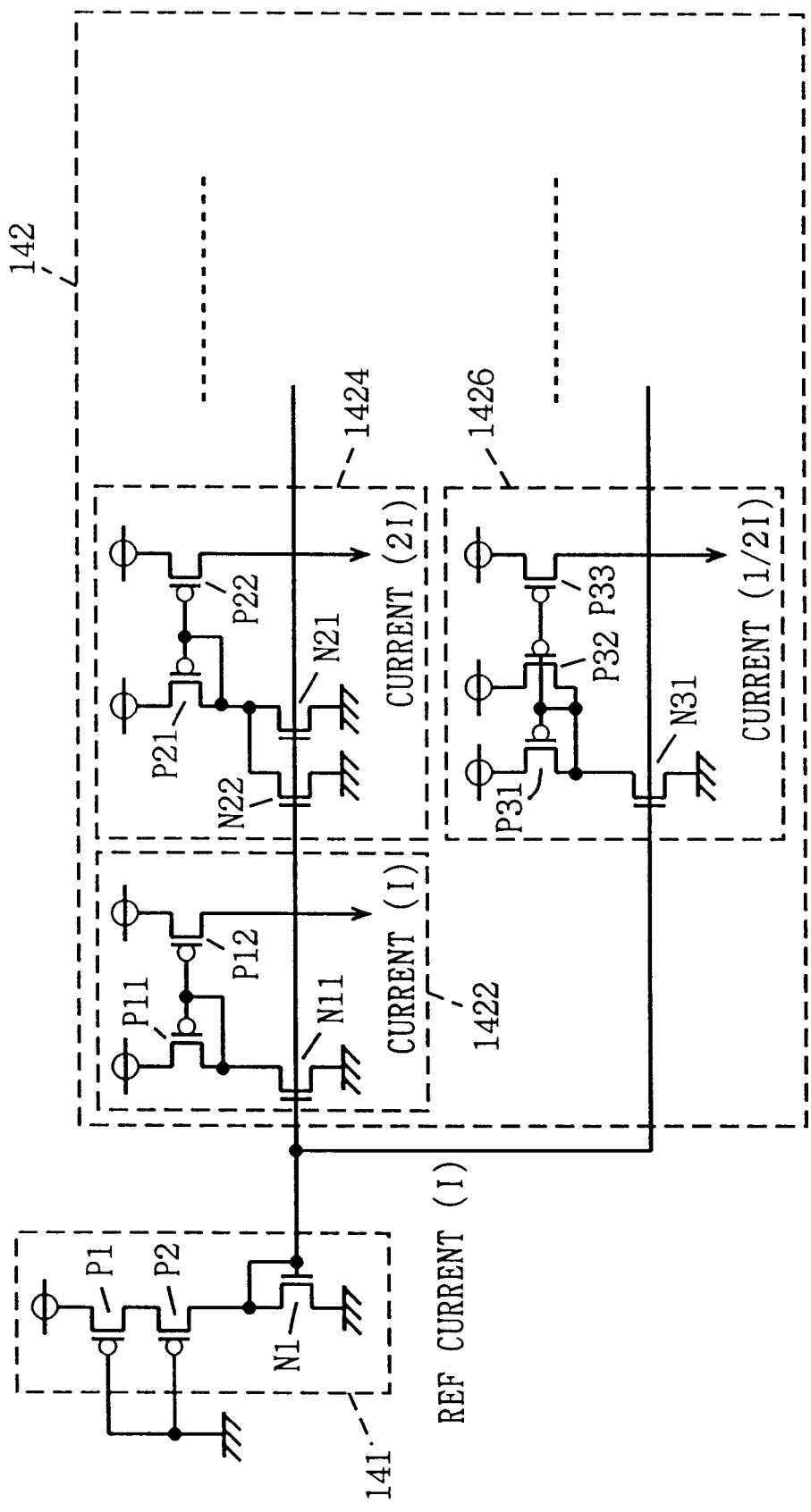
FIG. 7 is a circuit diagram showing a configuration of a reference current generating circuit 141 and a configuration of a group of constant current supply cells 142.

FIG. 7 is a circuit diagram showing a configuration of reference current generating circuit 141 and the group of constant current supply cells 142.

Reference current generating circuit 141 includes p-channel MOS transistors P1 and P2 and an n-channel MOS transistor N1 connected in series between a power supply voltage Vcc and a ground potential Vss. P-channel MOS transistors P1 and P2 have their gates receiving a ground potential and operate as a constant current supply.

The gate of n-channel MOS transistor N1 is connected to the drain of n-channel MOS transistor N1 serving as a node connecting n-channel MOS transistor N1 and p-channel MOS transistor P2 together.

The source/drain current passing through n-channel MOS transistor N1 corresponds to reference current I.

Among the constant current supply cells included in the group of constant current supply cells 142, a constant current supply cell 1422 which outputs current I includes p- and n-channel MOS transistors P11 and N11 connected in series between power supply voltage Vcc and ground potential Vss, and a p-channel MOS transistor P12 which receives power supply voltage Vcc at its source. The gates of p-channel MOS transistors P11 and P12 are connected together and the gate and drain of p-channel MOS transistor P11 are connected together. Thus, p-channel MOS transistors P11 and P12 are paired and thus operate as a current mirror circuit.

Since the gates of n-channel MOS transistors N1 and N11 are connected together, n-channel MOS transistors N1 and N11 pass the same current I. Thus, the current mirror circuit configured of p-channel MOS transistors P11 and P12 also passes current I and constant current supply cell 1422 thus outputs current I.

Among the constant current supply cells included in the group of constant current supply cells 142, a constant current supply cell 1424 which outputs a current 2I includes: a p-channel MOS transistor P21 and an n-channel MOS transistor N21 connected in series between power supply voltage Vcc and ground potential Vss; and n-channel MOS transistor N22 connected between p-channel MOS transistor P21 and ground potential Vss and in parallel with n-channel MOS transistor N21; and a p-channel MOS transistor P22 which receives power supply voltage Vcc at its source. The gates of p-channel MOS transistors P21 and P22 are connected together, and the gate and drain of p-channel MOS transistor p21 are connected together. Thus, p-channel MOS transistors P21 and P22 are also paired and thus operate as a current mirror circuit.

Since the gate of n-channel MOS transistor N1 and those of n-channel MOS transistors N21 and N22 are connected together, n-channel MOS transistors N1, N21 and N22 pass the same current I. Thus, the current mirror circuit configured of p-channel MOS transistors P21 and P22 passes current 2I and constant current supply cell 1424 thus outputs current 2I.

Among the constant current supply cells included in the group of constant current supply cells 142, a constant current supply cell 1426 which outputs a current I/2 includes: a p-channel MOS transistor P31 and an n-channel MOS transistor N31 connected in series between power supply voltage Vcc and ground potential Vss; a p-channel MOS transistor P32 connected between n-channel MOS transistor N31 and power supply voltage Vcc and in parallel with p-channel MOS transistor P31; and a p-channel MOS transistor P33 which receives power supply voltage Vcc at its source. The gates of p-channel MOS transistors P31, P32 and P33 are connected together, and the gate and drain of p-channel MOS transistor P31 are connected together.

Since the gates of n-channel MOS transistors N1 and N31 are connected together, n-channel MOS transistors N1 and N31 pass the same current I. Thus, p-channel MOS transistors P31 and P32 each passes current I/2. P-channel MOS transistor P33 also passes current I/2 and constant current supply cell 1426 thus outputs current I/2.

The other constant current supply cells have a same basic configuration, except that the number of p- or n-channel MOS transistors connected in parallel varies depending on the value of the output current.

Figure 8:
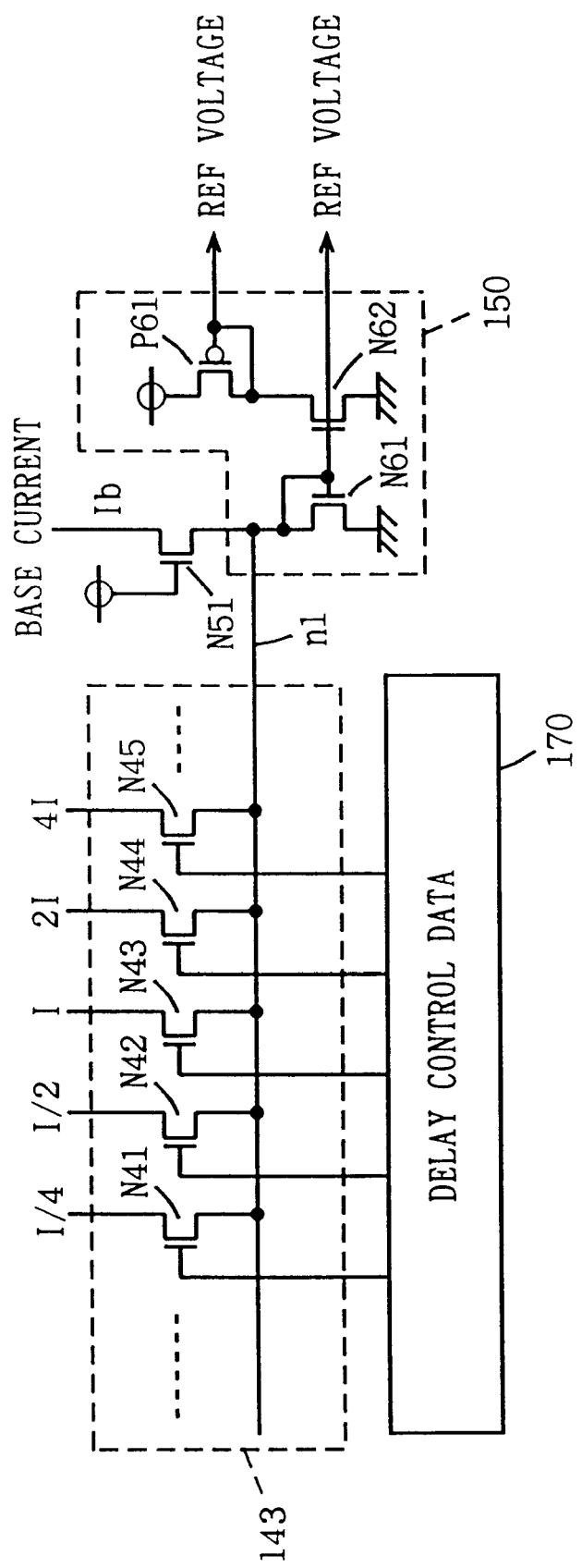
FIG. 8 is a schematic block diagram showing a configuration of a current combination circuit 143 and a configuration of a voltage generating circuit 150.

FIG. 8 is a schematic block diagram showing a configuration of current combining circuit 143 and current generating circuit 150.

Current combining circuit 143 includes n-channel MOS transistors N41 to N45, each having a gate potential controlled depending on each bit value in the binary notation of delay control data held in delay control data holding circuit 170. N-channel MOS transistors N41 to N45 each have its drain receiving a current from an associated constant current supply cell and its source connected to an output node n1.

It should be noted that although FIG. 8 only shows five of the n-channel MOS transistors and thus does not show the other n-channel MOS transistors, the number of n-channel MOS transistors provided correspond to the number of bits of delay control data.

Also connected to output node n1 is an n-channel MOS transistor N51 which supplies base current Ib.

Voltage generating circuit 150 includes an n-channel MOS transistor N61 connected between output node n1 and ground potential Vss, and a p-channel MOS transistor P61 and an n-channel MOS transistor N62 connected in series between power supply voltage Vcc and ground potential Vss.

The gates of n-channel MOS transistors N61 and N62 are connected together, and the gate and drain of n-channel MOS transistor N61 are connected together. Thus, n-channel MOS transistors N61 and N62 are paired and thus operate as a current mirror circuit.

That is, a current having the same value as the current supplied to output node n1 is also passed through n-channel MOS transistor N62 and p-channel MOS transistor P61.

The gate potential of p-channel MOS transistor P61 is output as a reference voltage Vrp, and the gate voltage of n-channel MOS transistor N62 is output as reference voltage Vrn.

Figure 9:
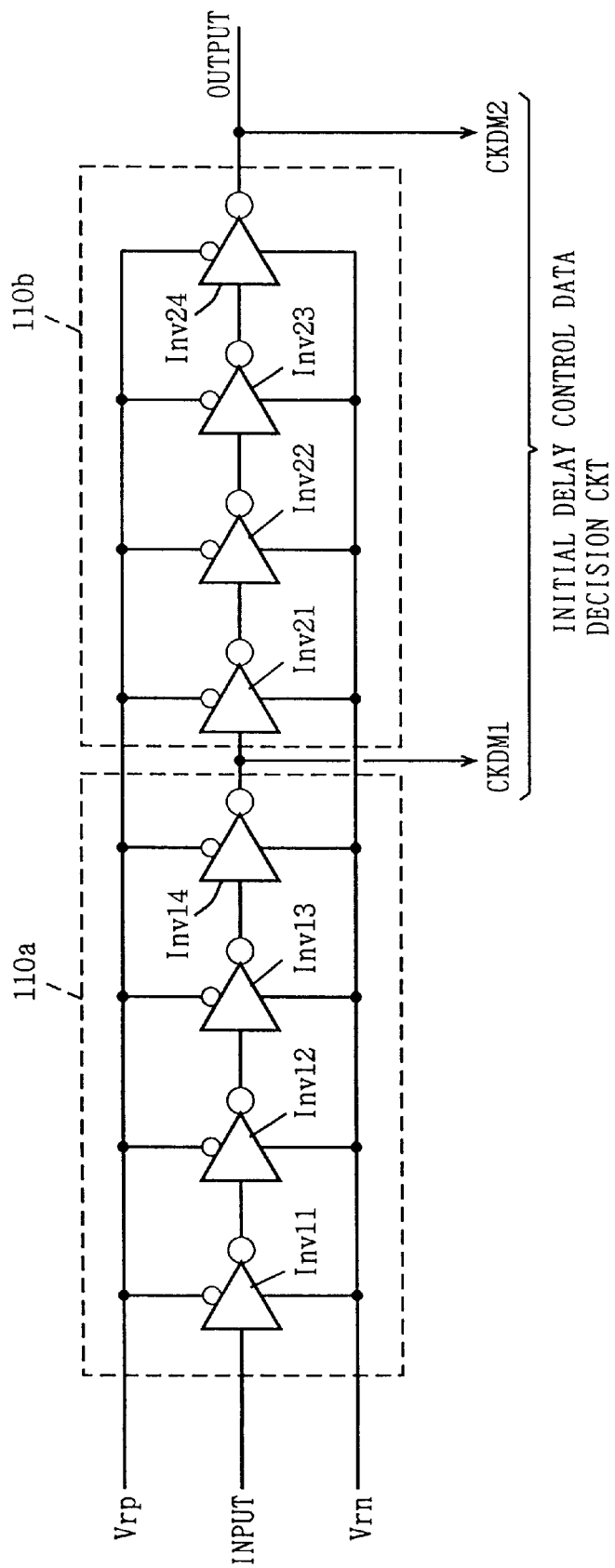
FIG. 9 is a block diagram showing a configuration of delay circuits 110a and 110b in a variable delay circuit 110.

FIG. 9 is a block diagram showing a configuration of delay circuits 110a and 110b in variable delay circuit 110.

Delay circuit 110a includes a train of inverters Inv11 to Inv14 in four stages, and delay circuit 110b includes a train of inverters Inv21 to Inv24 in four stages.

An output CKDM1 from delay circuit 110a and an output from CKDM2 from delay circuit 110b are applied to initial delay control data decision circuit 160.

Inverters Inv11 to Inv24 each operate on the operating current depending on reference voltages Vrp and Vrn.

Delay circuits 110c and 110d are also similar in configuration to delay circuits 110a and 110b, except that the signals output from delay circuits 110c and 110d are signals CK, and MD4, respectively.

Figure 10:
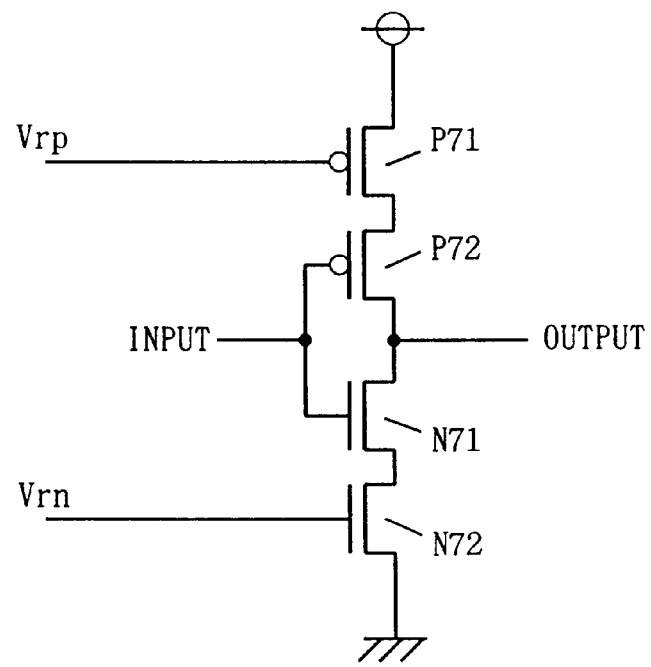
FIG. 10 is a circuit diagram showing a configuration of inverter Inv11 shown in FIG. 9.

FIG. 10 is a circuit diagram showing a configuration of inverter Inv11 shown in FIG. 9.

Inverter Inv11 includes p-channel MOS transistors P71 and P72 and n-channel MOS transistors N71 and N72 connected in series between power supply voltage Vcc and ground voltage Vss.

P-channel MOS transistor P71 receives reference voltage Vrp at its gate, and n-channel MOS transistor N72 receives reference voltage Vrn at its gate.

P- and n-channel MOS transistors P72 and N71 receive an input signal at their respective gates, and output an output signal from their connection node.

In other words, inverter Inv11 has the value of its operating current controlled depending on reference voltages Vrp and Vrn, and inverter Inv11 has its delay time decreased as the value of its operating current is increased.

The other inverters Inv12 to Inv24 also have a similar configuration.

Figure 11:
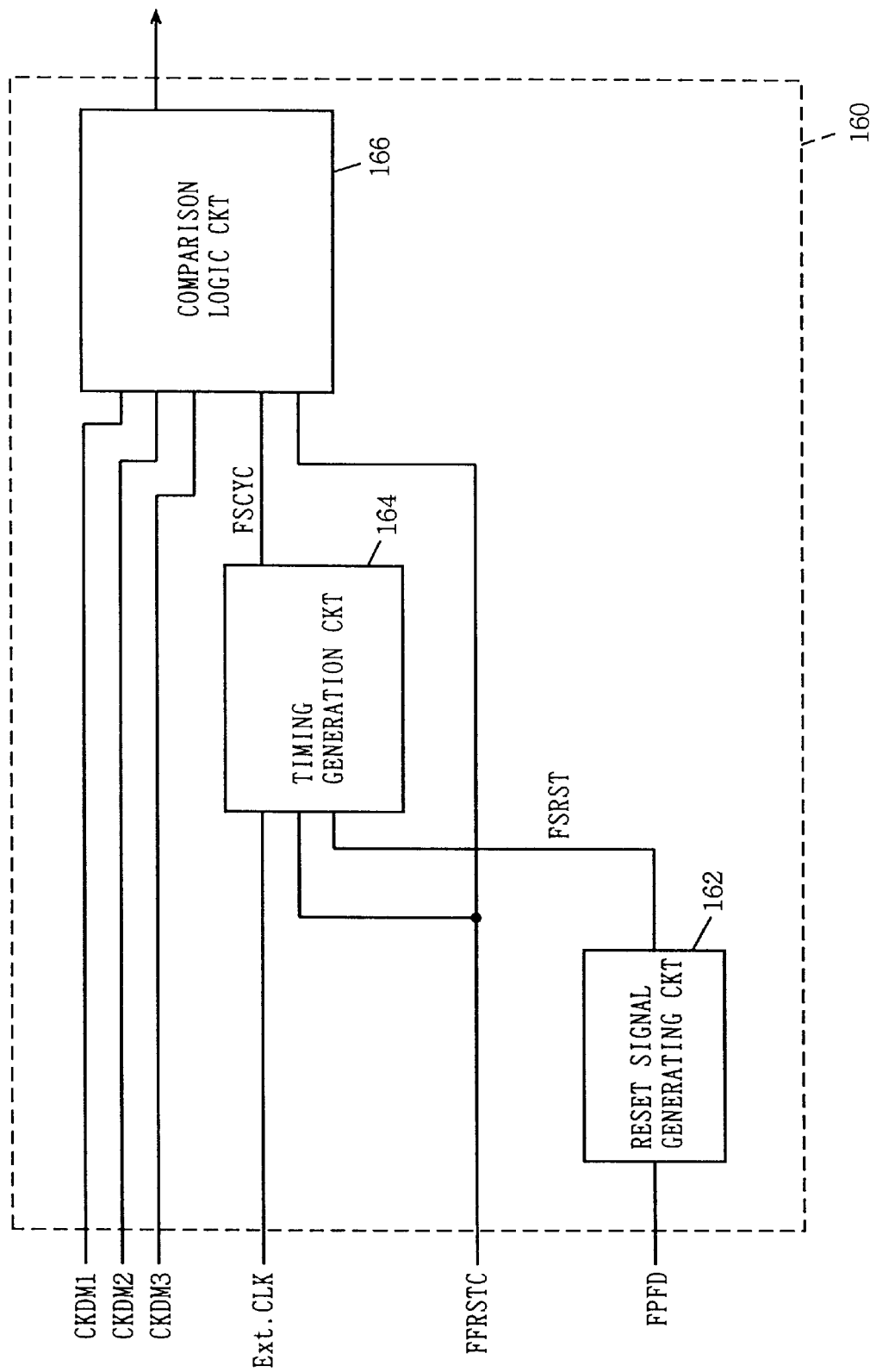
FIG. 11 is a schematic block diagram showing a configuration of an initial delay control data decision circuit 160.

FIG. 11 is a schematic block diagram showing a configuration of initial delay control data decision circuit 160.

Referring to FIG. 11, initial delay control data decision circuit 160 includes: a timing generation circuit 164 reset in response to signal FFRSTC from detection control circuit 190 to start the operation of counting the external clock signal Ext.CLK to control the timing of a signal FSCYC; a comparison logic circuit 166 receiving signals CKDM1 to CKDM3 from variable delay circuit 110 and detecting at the timing of signal FSCYC which of signals CKDM1 to CKDM3 is activated, to output an initial value of delay control; and a reset signal generating circuit 162 responsive to signal FPFD from detection control circuit 190 for outputting a reset signal FSRST for timing generation circuit 164.

Figure 12:
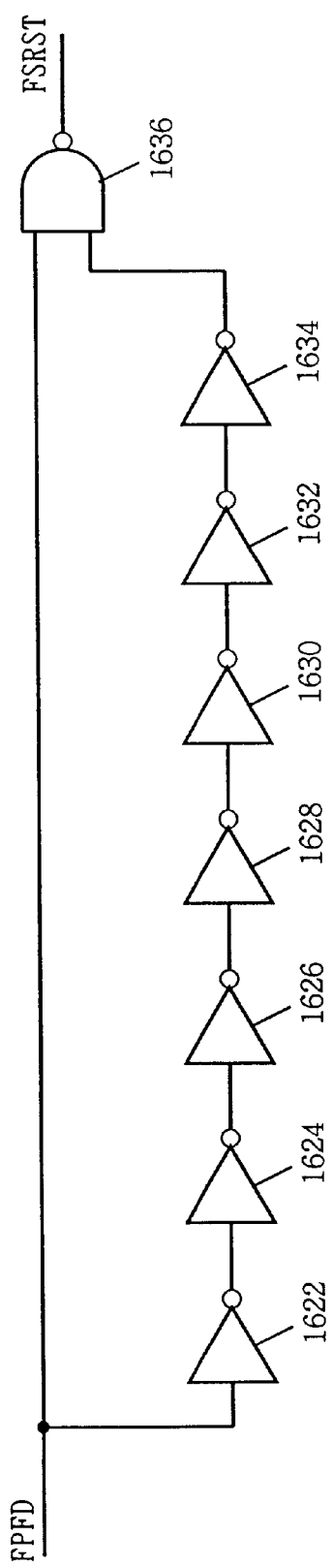
FIG. 12 is a block diagram showing a configuration of a reset signal generating circuit 162.

FIG. 12 is a block diagram showing a configuration of reset signal generating circuit 162.

Reset signal generating circuit 164 includes inverters 1622 to 1634 connected in series and receiving signal FPFD, and an NAND circuit 1636 receiving an output from inverter 1634 and signal FPFD as inputs.

In other words, reset signal generating circuit 162 responds to a rising edge of signal FPFD to output as signal FSRST a one-shot pulse having a pulse width determined depending on the delay time provided by the drain of inverters 1622 to 1634.

Figure 13:
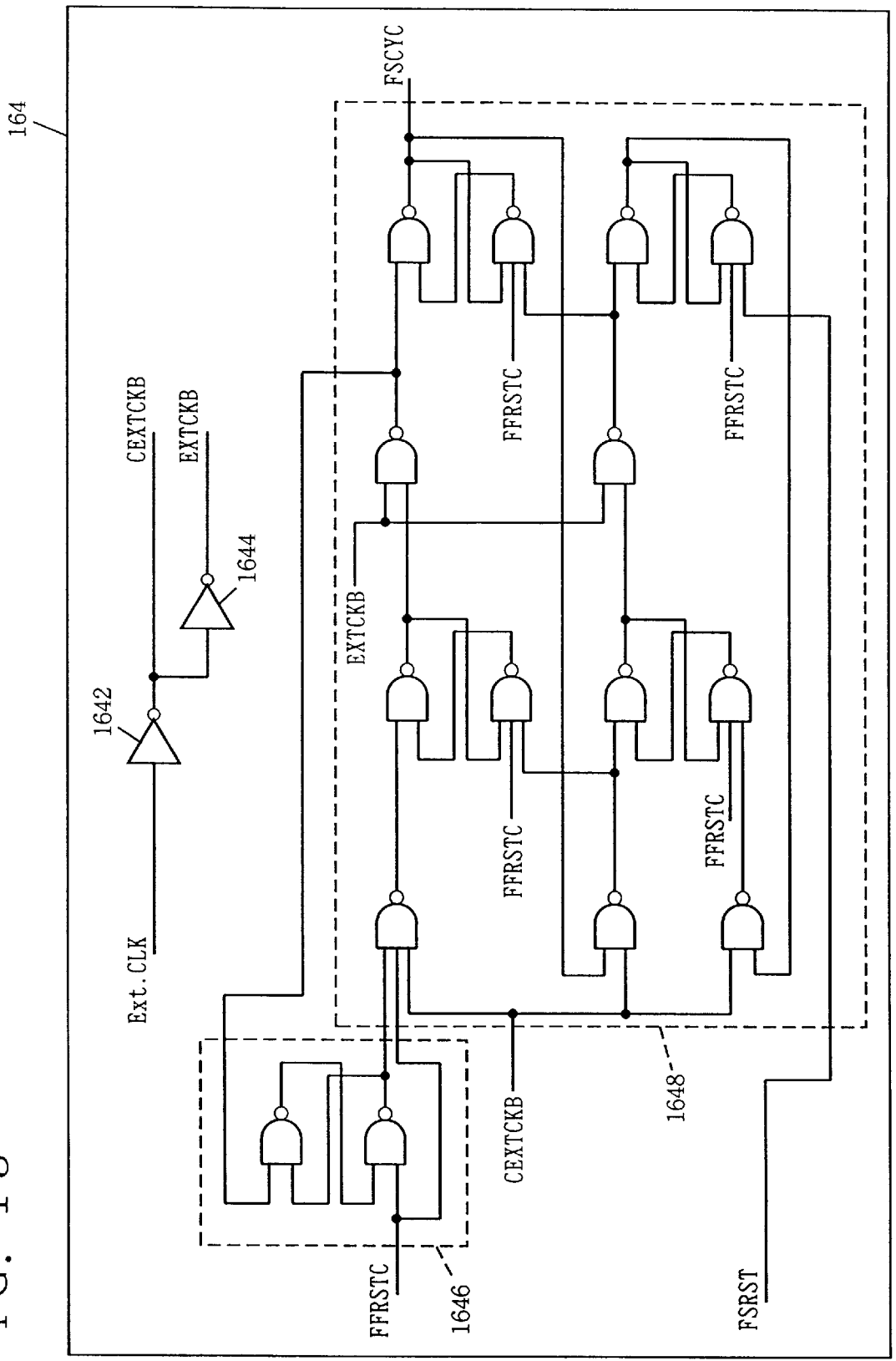
FIG. 13 is a block diagram showing a configuration of a timing generation circuit 164.

FIG. 13 is a block diagram showing a configuration of timing generation circuit 164.

Timing generation circuit 164 includes: an inverter 1642 which receives external clock signal Ext.CLK and generates the inverted version thereof; an inverter 1644 which receives, further inverts and outputs an output of inverter 1642; a flipflop circuit 1646 set in response to signal FFRSTC, and reset responsively when signal FSCYC transitions from a low level to a high level and then again returns to a low level; and a counter 1648 reset in response to an activated, high-level signal FFRSTC to start a count operation.

In other words, referring to FIGS. 5 and 13, timing generation circuit 164 responds to the high level of signal FFRSTC attained at time t4 to start a count operation and timing generation circuit 164 responds to the rising edge of external clock signal Ext.CLK at time t5 to allow signal FSCYC to attain a high level.

Timing generation circuit 164 then responds to the rising edge of external clock signal Ext.CLK at time t7 to allow signal FSCYC to attain a low level. Meanwhile, the output level of flipflop circuit 1646 is also reset and signal FSCYC is thus maintained at the low level thereafter.

Figure 14:
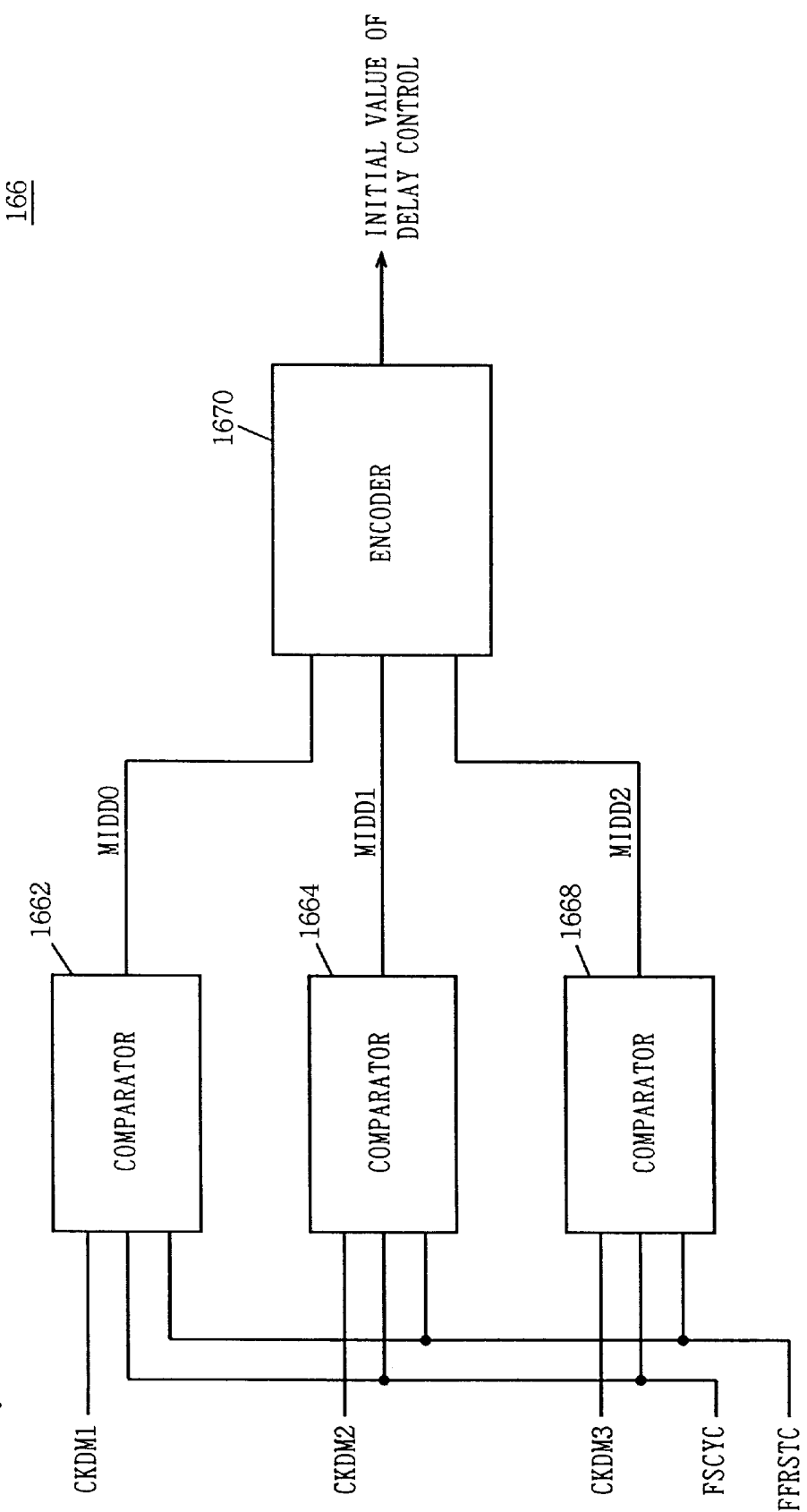
FIG. 14 is a schematic block diagram showing a configuration of a comparison logic circuit 166.

FIG. 14 is a schematic block diagram showing a configuration of comparison logic circuit 166.

Comparison logic circuit 166 includes: comparators 1662 to 1668 reset in response to signal FFRSTC and receiving and holding the levels of the associated signals CKDM1 to CKDM3 from variable delay circuit 110 while signal FSCYC is activated; and an encoder 1670 receiving outputs MIDD0 to MIDD2 from comparators 1662 to 1668 to output an initial value of delay control.

Figure 15:
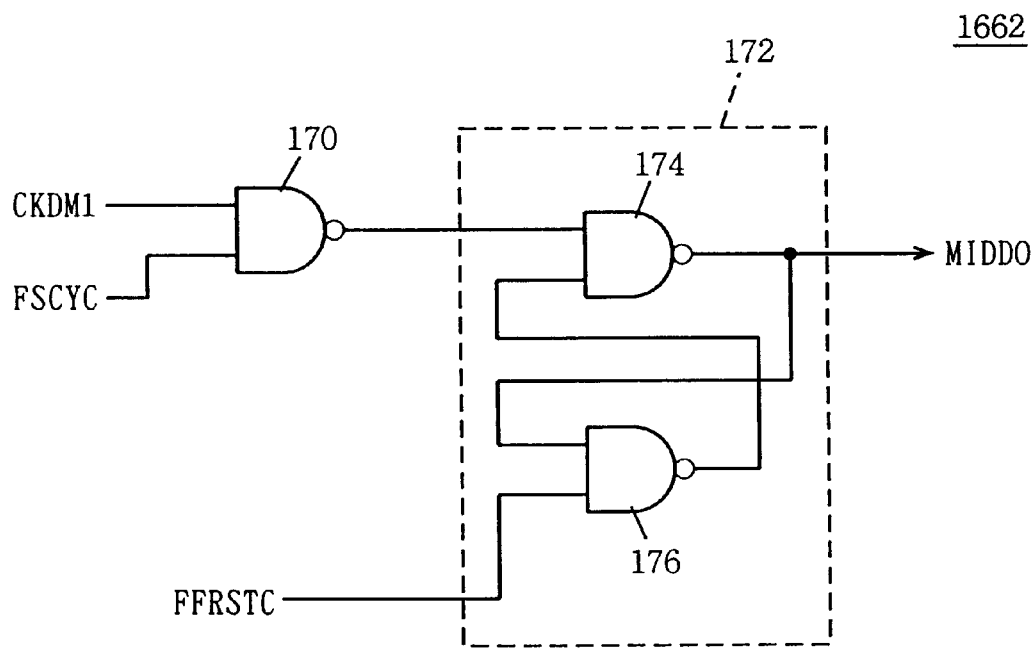
FIG. 15 is a block diagram showing a configuration of a comparator 1662 shown in FIG. 14.

FIG. 15 is a block diagram showing a configuration of comparator 1662 shown in FIG. 14.

Comparator 1662 includes: an NAND circuit 170 which receives signals CKDM1 and FSCYC; and a flipflop circuit 172 which is set by an output of NAND circuit 170 and reset by signal FFRSTC and outputs signal MIDD0. Flipflop circuit 172 includes cross-connected NAND circuits 174 and 176.

In other words, when signal FFRSTC resets the flipflop and signal CKDM1 is then activated while signal FSCYC is active, the flipflop places the level of signal MIDD0 in a set state.

The other comparators 1664 and 1668 have a similar configuration.

Figure 16:
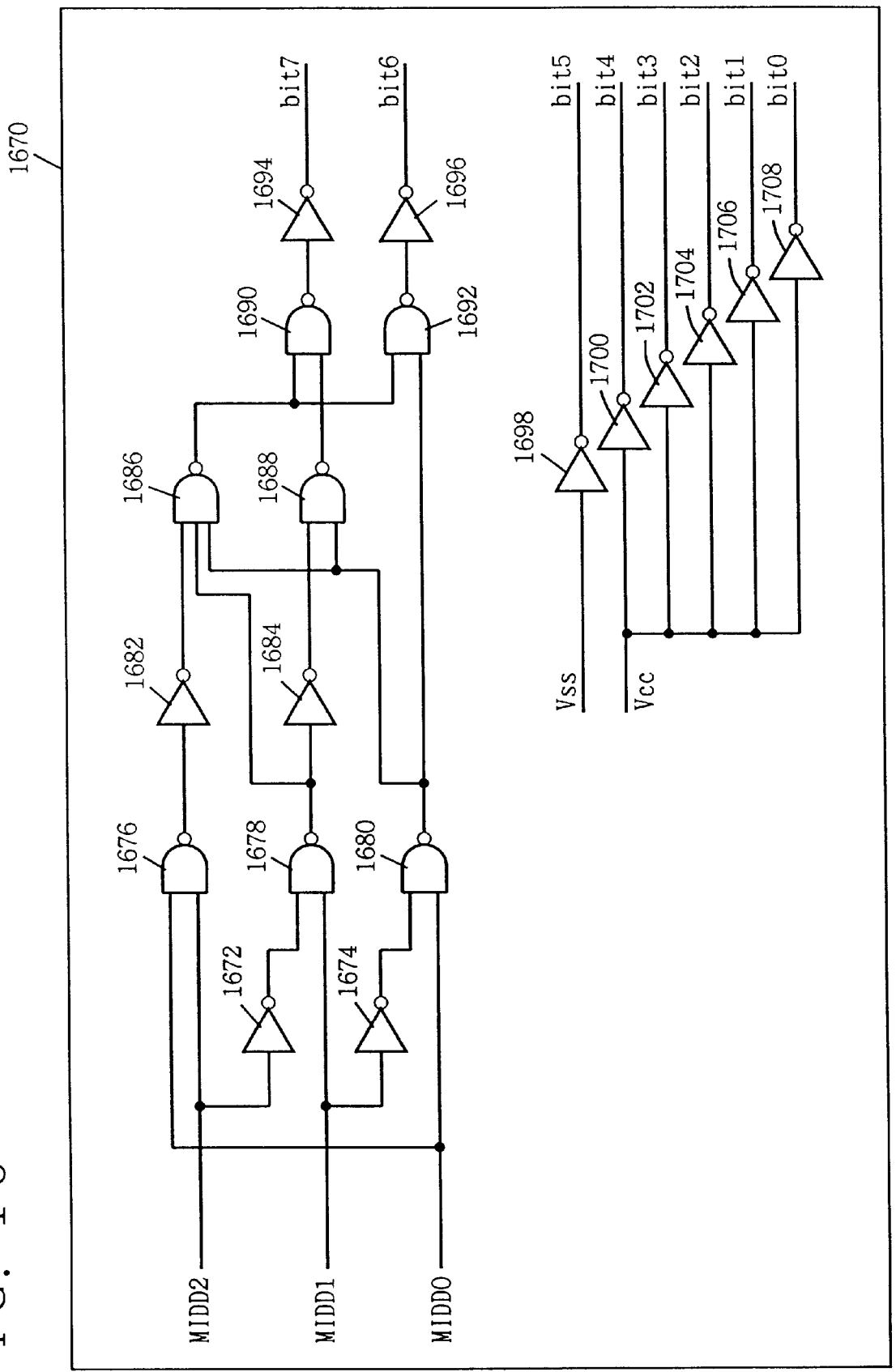
FIG. 16 is a schematic block diagram showing a configuration of an encoder 1670 shown in FIG. 14.
Figure 17:
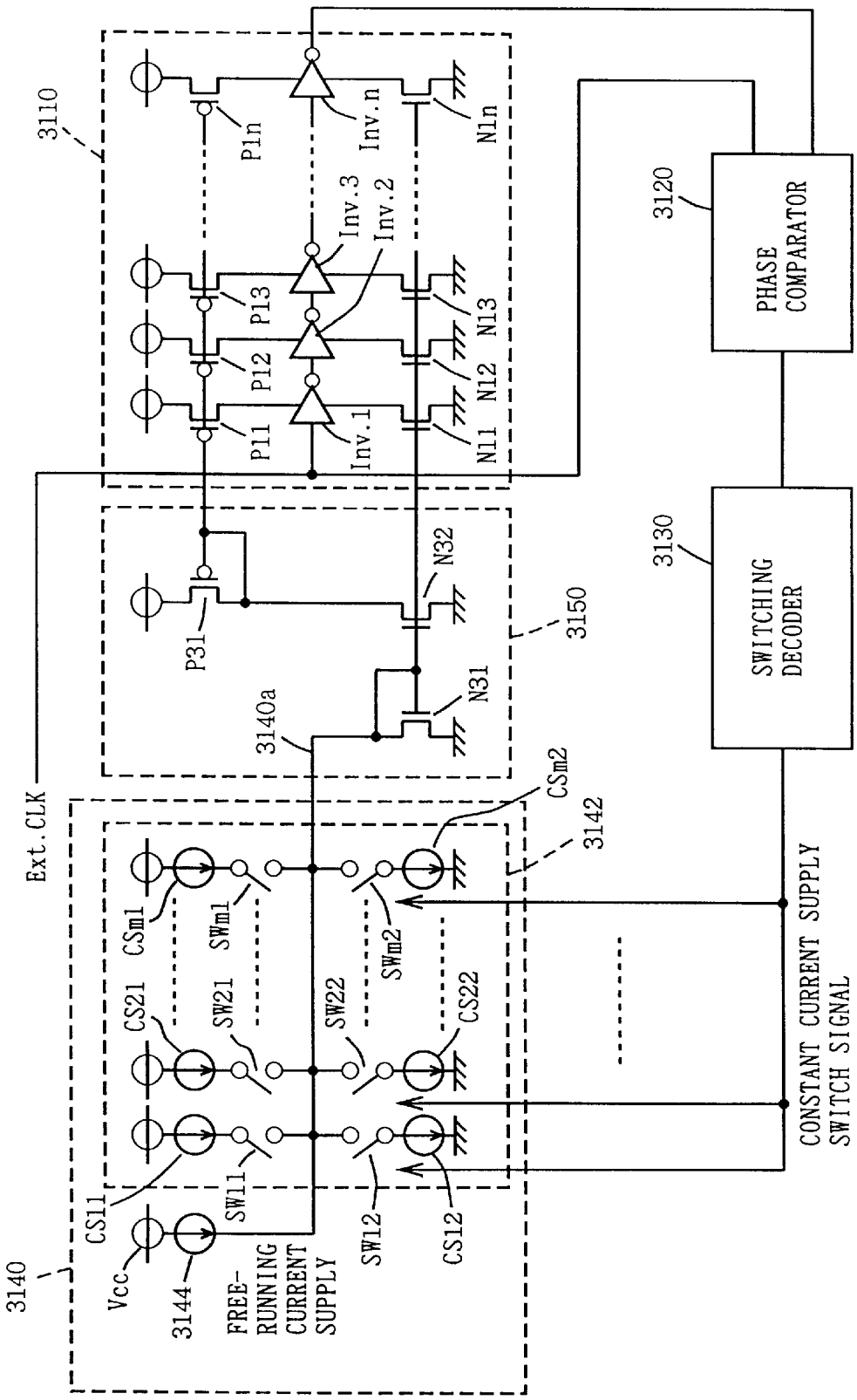
FIG. 17 is a schematic block diagram showing a configuration of a conventional, internally provided, synchronized signal generation circuit 3000.

FIG. 16 is a schematic block diagram showing a configuration of encoder 1670 shown in FIG. 14.

Encoder 1670 includes: an inverter 1672 which receives signal MIDD2; an inverter 1674 which receives signal MIDD1; an NAND circuit 1676 which receives signals MIDD0 and MIDD2; an NAND circuit 1678 which receives an output from inverter 1672 and signal MIDD1; an NAND circuit 1680 which receives an output from inverter 1674 and signal MIDD0; an inverter 1682 which receives an output from NAND circuit 1676; an inverter 1684 which receives an output from NAND circuit 1678; a 3-input NAND circuit 1686 which receives an output from inverter 1682, an output from NAND circuit 1678 and an output from NAND circuit 1680; an NAND circuit 1688 which receives an output from inverter 1684 and the output from NAND circuit 1680; an NAND circuit 1690 which receives an output from 3-input NAND circuit 1686 and an output from NAND circuit 1681; an NAND circuit 1692 which receives the output from 3-input NAND circuit 1686 and the output from NAND circuit 1680; an inverter 1694 which receives an output from NAND circuit 1690 and outputs the data of the seventh bit of an initial value of delay control, i.e. a bit 7; and an inverter 1696 which receives an output from NAND circuit 1692 and outputs the data of the sixth bit of the initial value of delay control, i.e. a bit 6.

Encoder 1670 also includes: an inverter 1698 which receives the ground potential level as an input and outputs the data of the fifth bit of the initial value of delay control, i.e. a bit 5; and inverters 1700 to 1708 each receiving power supply potential Vcc as an input and respectively outputting the data of the fourth to 0th bits of the initial value of delay control, i.e. bits 4 to 0.

Thus, the values of bits 4 to 0 are all fixed at 0, and the value of bit 5 is fixed at 1.

The values of bits 7 and 6 are provided as the values encoded depending on the levels of signals MIDD0 to MIDD2.

The configuration described above allows an initial value of delay control to be encoded as a binary value depending on the detected result of test signal propagation and thus stored in delay control data holding circuit 170.

According to the present embodiment, variable delay circuit 110 includes four delay circuits 110a to 110d and the values of the most significant two bits of an 8-bit initial value of delay control are only encoded in response to signals CKDM1 to CKDM3 output from the associated respective delay circuits. However, the present invention is not limited as described above, and the number of the delay circuits and the number of the bit data of an initial value of delay control encoded and thus determined can be increased or decreased depending on the number of the bits of delay control data.

Thus, the present invention can provide a synchronous semiconductor memory device having an internally provided, synchronized signal generating circuit capable of reducing the time required for completing a synchronization operation in highly precise phasing.

The present invention can also provide a synchronous semiconductor memory device having an internally provided, synchronized signal generating circuit capable of reducing increment in number of circuit elements and rapidly controlling the delay time when a binary value of delay control is employed to control the amount of delay of the delay circuits.

Although the present invention has been described and illustrated in detail, it is dearly understood that the same is by way of illustration and example only and is not to be taken by way of limitation, the spirit and scope of the present invention being limited only by the terms of the appended claims.

What is claimed is:

1. A digital delay locked loop circuit comprising:
   a variable delay circuit having a delay time controlled by digital delay control data, for delaying an external clock signal and generating an internal clock signal; and
   a delay control circuit for providing said digital delay control data to control a phasing of the internal and external clock signals, and initializing said digital delay control data, wherein said delay control circuit includes an initial delay control data decision circuit for determining an initial value for said digital delay control data.

2. The digital delay locked loop circuit according to claim 1, wherein:
   a first step of said phasing is performed initially; and
   the precision of the first step is lower than the precision of a final step of said phasing.

3. The digital delay locked loop circuit according to claim 1, wherein said initial delay control data decision circuit determines said initial value for said digital delay control data in accordance with comparing m/n times the delay time with a cycle of the external clock signal, wherein n is a natural number and m is a natural number smaller than n.

4. The digital delay locked loop circuit according to claim 3, wherein:
   said variable delay circuit includes a plurality of delay circuits connected in series; and
   an output of the delay circuit among said plurality of delay circuits provides the compared delay time.

5. The digital delay locked loop circuit according to claim 3, wherein:
   said delay control circuit includes a delay control data hold circuit for holding the initial value.

6. The digital delay locked loop circuit according to claim 3, wherein:
   said delay control circuit determines the initial value for one cycle time of the external clock signal.

7. The digital delay locked loop circuit according to claim 3, wherein:
   said delay control circuit includes a detection control circuit for controlling the operation of determining the initial value.

8. The digital delay locked loop circuit according to claim 1, wherein:
   a delay control circuit includes a delay control data hold circuit for holding an initial value for said digital delay control data.

9. The digital delay locked loop circuit according to claim 8, wherein:
   said delay control circuit includes a comparator for comparing the internal clock signal with the external clock signal, and
   a comparison result of said comparator is disabled when said delay control data hold circuit holds the initial value.

10. The digital delay locked loop circuit according to claim 8, wherein:
    said delay control circuit performs a shift operation of said digital delay control data to control the phasing of the internal and external clock signals after determining the initial value.

11. The digital delay locked loop circuit according to claim 8, wherein said delay control circuit includes:
    a detection control circuit for controlling the operation of determining the initial value;
    a first multiplexer controlled by said detection control circuit, for providing either one of the external clock signal and a reset level potential to said variable delay circuit;
    a comparator for comparing the internal clock signal with the external clock signal;
    a shift logic circuit for increasing/decreasing the value of said digital delay control data in response to a comparison result of said comparator;
    a second multiplexer controlled by said detection control circuit, for providing either one of the initial value and an output of said shift logic circuit; and
    a delay control data hold circuit controlled by said detection control circuit, for holding said digital delay control data.

* * * * *

UNITED STATES PATENT AND TRADEMARK OFFICE
CERTIFICATE OF CORRECTION

PATENT NO.    : 6,178,123
DATED         : January 23, 2001
INVENTOR(S)   : Yoichi Kato et al.

It is certified that error appears in the above-identified patent and that said Letters Patent is hereby corrected as shown below:

Column 12,
Line 30, replace "voltage" (second occurrence) with -- potential --;
Line 52, replace "voltage" with -- potential --.

Column 15, claim 5,
Line 3, insert -- further -- before "includes";

Column 16, claim 7,
Line 3, insert -- further -- before "includes";

Claim 8,
Line 3, replace "a" (first occurrence) with -- the --; and insert -- further -- before "includes";

Claim 9,
Line 3, insert -- further -- before "includes";

Claim 11,
Line 2, insert -- further -- before "includes".

Please add new claim 12 as follows:
-- 12. The digital delay locked loop circuit according to claim 10, wherein
said variable delay circuit includes a plurality of internal delay circuits connected in series, each having an internal delay time controlled by said digital delay control data;

said initial delay control data decision circuit includes:

a test signal generating circuit to apply a test signal to said variable delay circuit in said first step, and a delay measuring circuit detecting to which of said plurality of internal delay circuits said test signal is propagated for a predetermined period of time, to determine said initial value of said digital delay control data in said first step; and

UNITED STATES PATENT AND TRADEMARK OFFICE
CERTIFICATE OF CORRECTION

PATENT NO. : 6,178,123
DATED : January 23, 2001
INVENTOR(S) : Yoichi Kato, et al.

It is certified that error appears in the above-identified patent and that said Letters Patent is hereby corrected as shown below:

said delay control circuit changes said digital delay control data to control each of said internal delay time after said first step. --.

Signed and Sealed this

Fourth Day of December, 2001

*Attest:*

*Attesting Officer*

NICHOLAS P. GODICI
*Acting Director of the United States Patent and Trademark Office*

UNITED STATES PATENT AND TRADEMARK OFFICE
CERTIFICATE OF CORRECTION

PATENT NO. : 6,178,123 B1
DATED : January 23, 2001
INVENTOR(S) : Yoichi Kato et al.

It is certified that error appears in the above-identified patent and that said Letters Patent is hereby corrected as shown below:

Column 12,
Line 30, replace "voltage" (second occurrence) with -- potential --;
Line 52, replace "voltage" with -- potential --.

Column 15,
Line 45, insert -- further -- before "includes";

Column 16,
Line 5, insert -- further -- before "includes";
Line 10, replace "a" (first occurrence) with -- the --; and insert -- further -- before "includes";
Line 15, insert -- further -- before "includes";
Line 29, insert -- further -- before "includes".
Line 48, -- 12. The digital delay locked loop circuit according to claim 2, wherein said variable delay circuit includes a plurality of internal delay circuits connected in series, each having an internal delay time controlled by said digital delay control data;

said initial delay control data decision circuit includes:

a test signal generating circuit to apply a test signal to said variable delay circuit in said first step, and a delay measuring circuit detecting to which of said plurality of internal delay circuits said test signal is propagated for a predetermined period of time, to determine said initial value of said digital delay control data in said first step; and

UNITED STATES PATENT AND TRADEMARK OFFICE
CERTIFICATE OF CORRECTION

PATENT NO. : 6,178,123 B1
DATED : January 23, 2001
INVENTOR(S) : Yoichi Kato et al.

It is certified that error appears in the above-identified patent and that said Letters Patent is hereby corrected as shown below:

said delay control circuit changes said digital delay control data to control each of said internal day time after said first step. --.

This certificate supersedes Certificate of Correction issued December 4, 2001.

Signed and Sealed this

Nineteenth Day of November, 2002

Attest:

JAMES E. ROGAN
Attesting Officer           Director of the United States Patent and Trademark Office

UNITED STATES PATENT AND TRADEMARK OFFICE
CERTIFICATE OF CORRECTION

PATENT NO. : 6,178,123 B1
DATED : January 23, 2001
INVENTOR(S) : Yoichi Kato et al.

It is certified that error appears in the above-identified patent and that said Letters Patent is hereby corrected as shown below:

Column 12,
Line 30, replace "voltage" (second occurrence) with -- potential --;
Line 52, replace "voltage" with -- potential --.

Column 15,
Line 45, insert -- further -- before "includes";

Column 16,
Line 5, insert -- further -- before "includes";
Line 10, replace "a" (first occurrence) with -- the --; and insert -- further -- before "includes";
Line 15, insert -- further -- before "includes";
Line 29, insert -- further -- before "includes".
Line 48, -- 12. The digital delay locked loop circuit according to claim 2, wherein said variable delay circuit includes a plurality of internal delay circuits connected in series, each having an internal delay time controlled by said digital delay control data;

said initial delay control data decision circuit includes:

a test signal generating circuit to apply a test signal to said variable delay circuit in said first step, and a delay measuring circuit detecting to which of said plurality of internal delay circuits said test signal is propagated for a predetermined period of time, to determine said initial value of said digital delay control data in said first step; and

UNITED STATES PATENT AND TRADEMARK OFFICE
CERTIFICATE OF CORRECTION

PATENT NO. : 6,178,123 B1
DATED : January 23, 2001
INVENTOR(S) : Yoichi Kato et al.

It is certified that error appears in the above-identified patent and that said Letters Patent is hereby corrected as shown below:

said delay control circuit changes said digital delay control data to control each of said internal delay time after said first step. --.

This certificate supersedes Certificate of Correction issued December 4, 2001 and November 19, 2002.

Signed and Sealed this

Twenty-eighth Day of January, 2003

JAMES E. ROGAN
*Director of the United States Patent and Trademark Office*